(12) United States Patent
Brooks et al.

(10) Patent No.: US 6,384,753 B1
(45) Date of Patent: May 7, 2002

(54) HIGH DENSITY ANALOG INTERFACE

(75) Inventors: Thomas Brooks, Blacksburg; Edwin Thurnau, McGaheysville, both of VA (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/681,638

(22) Filed: May 15, 2001

(51) Int. Cl.[7] .................................................. H03M 1/06
(52) U.S. Cl. ..................... 341/118; 341/120; 341/121; 341/126; 341/155; 341/141; 341/139; 700/286; 700/293; 700/295; 375/224; 375/244; 375/252; 375/298; 375/322
(58) Field of Search ................................ 341/118, 120, 341/121, 126, 139, 141, 155

(56) References Cited

U.S. PATENT DOCUMENTS

| | | | |
|---|---|---|---|
| 5,063,383 A | * | 11/1991 | Bobbs .......................... 341/120 |
| 5,185,607 A | * | 2/1993 | Lyon et al. ................... 341/120 |
| 5,511,095 A | | 4/1996 | Inoue et al. |
| 5,600,678 A | | 2/1997 | Petranovich et al. |
| 5,703,910 A | | 12/1997 | Durvaux et al. |
| 5,719,902 A | | 2/1998 | Quick et al. |
| 5,943,088 A | | 8/1999 | Sakemi et al. |
| 6,081,215 A | * | 6/2000 | Kost et al. ................... 341/120 |
| 6,138,081 A | | 10/2000 | Olejack et al. |
| 6,229,466 B1 | * | 8/2001 | Gattani ........................ 341/120 |

* cited by examiner

*Primary Examiner*—Michael Tokar
*Assistant Examiner*—Lam T. Mai
(74) *Attorney, Agent, or Firm*—Karl Vick, Esq.; Damian Wasserbauer, Esq.; Armstrong Teasdale LLP

(57) ABSTRACT

An interface module includes a high density analog interface (HAI) for electrical interconnection between a programmable logic controller (PLC) and an analog to digital converter (ADC) or a digital to analog converter (DAC). The HAI includes a single application specific integrated circuit having a data scaling function block, a diagnostics function block configured to verify functionality of said scaling function block, a self-calibration function block configured to compensate for drift in said ADC, and a shared interface function block configured to electronically connect said module with a programmable logic controller (PLC).

35 Claims, 2 Drawing Sheets

HIGH DENSITY ANALOG INTERFACE

BACKGROUND OF THE INVENTION

This invention relates generally to electrical interfacing, and, more specifically, to electrical interfacing between a programmable logic controller (PLC) and a converter.

In known electronic systems, interfaces between a PLC and either an ADC or a DAC have typically been implemented with a combination of an application specific integrated circuit (ASIC) and a field programmable gate array (FPGA). Spreading the functionality of the interface across two chips increases the cost and the space requirements. Additionally, scaling of analog data by such interfaces has typically been performed using analog components, which also increases the cost of the interface and the space requirements.

Furthermore, known interfaces have compensated for drift associated with the interface by utilizing calibrating features that occur discretely, either at initial assembly, power up, or at maintenance times. Discrete calibration is typically implemented using either firmware/software or analog hardware, which increases the cost of the interface and requires additional board space. Also, diagnostics features in known interfaces have been implemented using analog components, which also increases the cost and space requirements of the interface. It would be desirable to provide an interface module that implements a data scaling feature, a calibration feature, and a diagnostics feature utilizing a single digital integrated circuit (IC). It would also be desirable for the calibration feature to be continuous over time.

SUMMARY OF INVENTION

In an exemplary embodiment, an analog interface module includes a high density analog interface (HAI) for electrical interconnection between a programmable logic controller (PLC) and a converter, such as, an analog to digital converter (ADC) or a digital to analog converter (DAC). The HAI includes a data scaling function block for scaling data between two operating modes, a diagnostics function block to verify proper system functionality, a self-calibration function block to compensate for drift associated with the ADC, and a shared register interface function block for electronically connecting the analog input module with a programmable logic controller (PLC).

More particularly, the HAI is a digital application specific integrated circuit (ASIC) that implements an interface from the backplane of a PLC to a family of ADC"s or DAC"s. The analog interface module provides data scaling, diagnostics, self-calibration, and a backplane interface using a single ASIC. Combining the different functional features onto a single ASIC reduces cost and saves board space.

DETAILED DESCRIPTION

Figure 1:
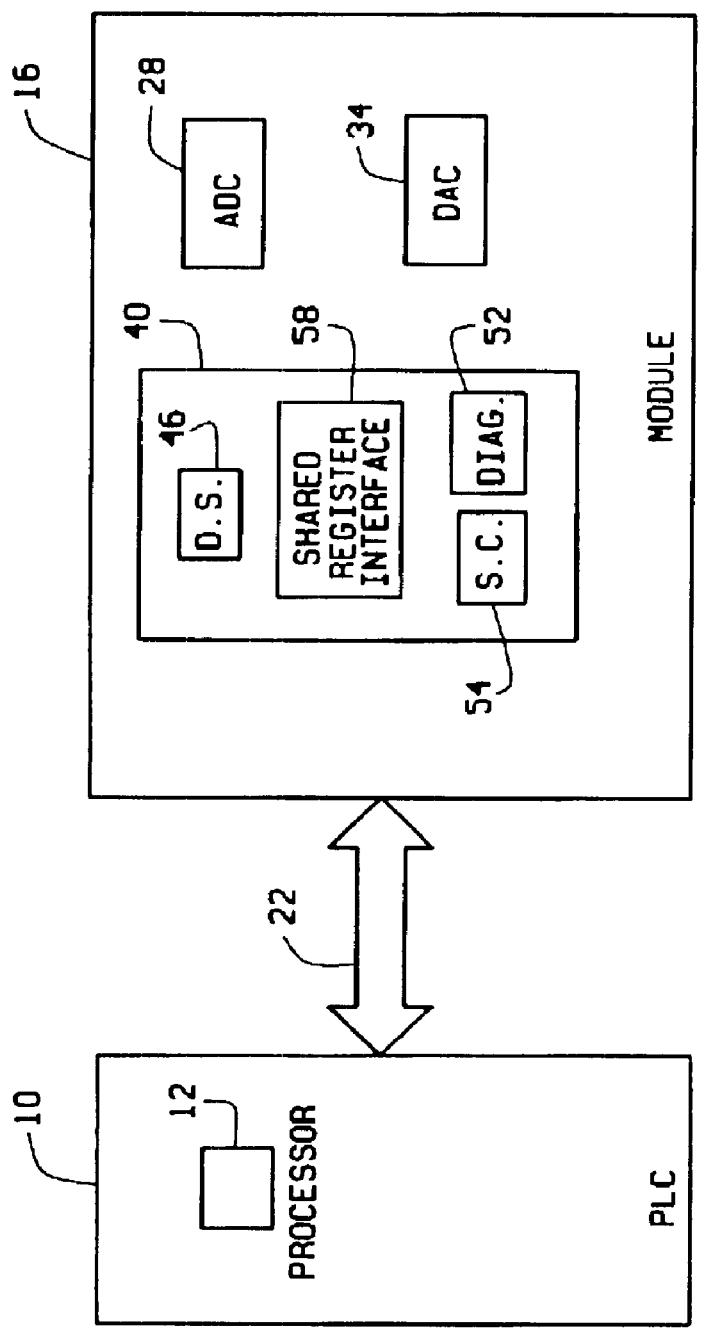
FIG. 1 is a diagram of a programmable logic controller (PLC) electronically connected, through a PLC backplane, to an analog input/output module in accordance with one embodiment of the present invention.

FIG. 1 is a diagram of a programmable logic controller (PLC) 10 electronically connected to an analog input/output (I/O) module 16 through a PLC backplane 22. PLC 10 includes a processor 12 suitable to execute all functions of PLC 10. Module 16 includes at least one analog to digital converter (ADC) 28 or digital to analog converter (DAC) 34, and a high density analog interface (HAI) 40. In an alternate embodiment, module 16 includes at least one ADC 28 and at least one DAC 34. HAI 40 provides an interface between PLC 10 and ADC 28, and between PLC 10 and DAC 34, via backplane 22. HAI 40 is an application specific integrated circuit (ASIC) implemented using very high speed integrated circuit hardware description language (VHDL). In one embodiment, the design of HAI 40 is divided into four major function blocks including a data scaling function block 46, a diagnostics function block 52, a self-calibration block 54, and a shared register interfacing function block 58.

Module 40 has the ability to operate in both a 0–20 mA range and a 4–20 mA range. The 4–20 mA range requires data to be scaled using data scaling function block 46. Data scaling function block 46 digitally scales data between two different linear ranges. When converting incoming data from ADC 28 in the 0–20 mA range to the 4–20 mA range, the data is scaled according to the function, $F(x)=(5/4)x8000$. When converting outgoing data to DAC 34 from the 0–20 mA range to the 4–20 mA range, the data is scaled according to the function, $F(x)=(4/5)x+6400$.

Diagnostics function block 52 implements two types of diagnostic functions. The first type of diagnostics is general fault diagnostics. A general fault error occurs when data from ADC 28 is skewed to such an extent that module 16 is not operating correctly. Diagnostics function block 52 is used as part of a normal channel sweep of ADC 28. In operation, diagnostics function block 52 reads a known analog value through a special diagnostics channel (not shown) of ADC 28. The resulting value is compared to a look up table containing ranges of acceptable resulting values for specific values read through ADC 28. If the resulting value is outside the acceptable range for the value input to ADC 28, an error bit is set in shared register interfacing function block 58. The PLC processor 12 then accesses the error bit and responds appropriately. For example, a user is notified of the error.

A second type of diagnostics implemented by diagnostics function block 52 is open wire detection, which detects an open wire on a channel of ADC 28. Open wire detection is only available when module 16 is operating in the 4–20 mA current input mode. In operation, diagnostics function block 52 reads analog values through a plurality of channels (not shown) of ADC 28. If a read value is below 2 mA, diagnostics function block 52 causes a bit to be set in shared register interfacing function block 58. Processor 12 accesses the error bit and responds appropriately. For example, a user is notified of the error.

Figure 2:
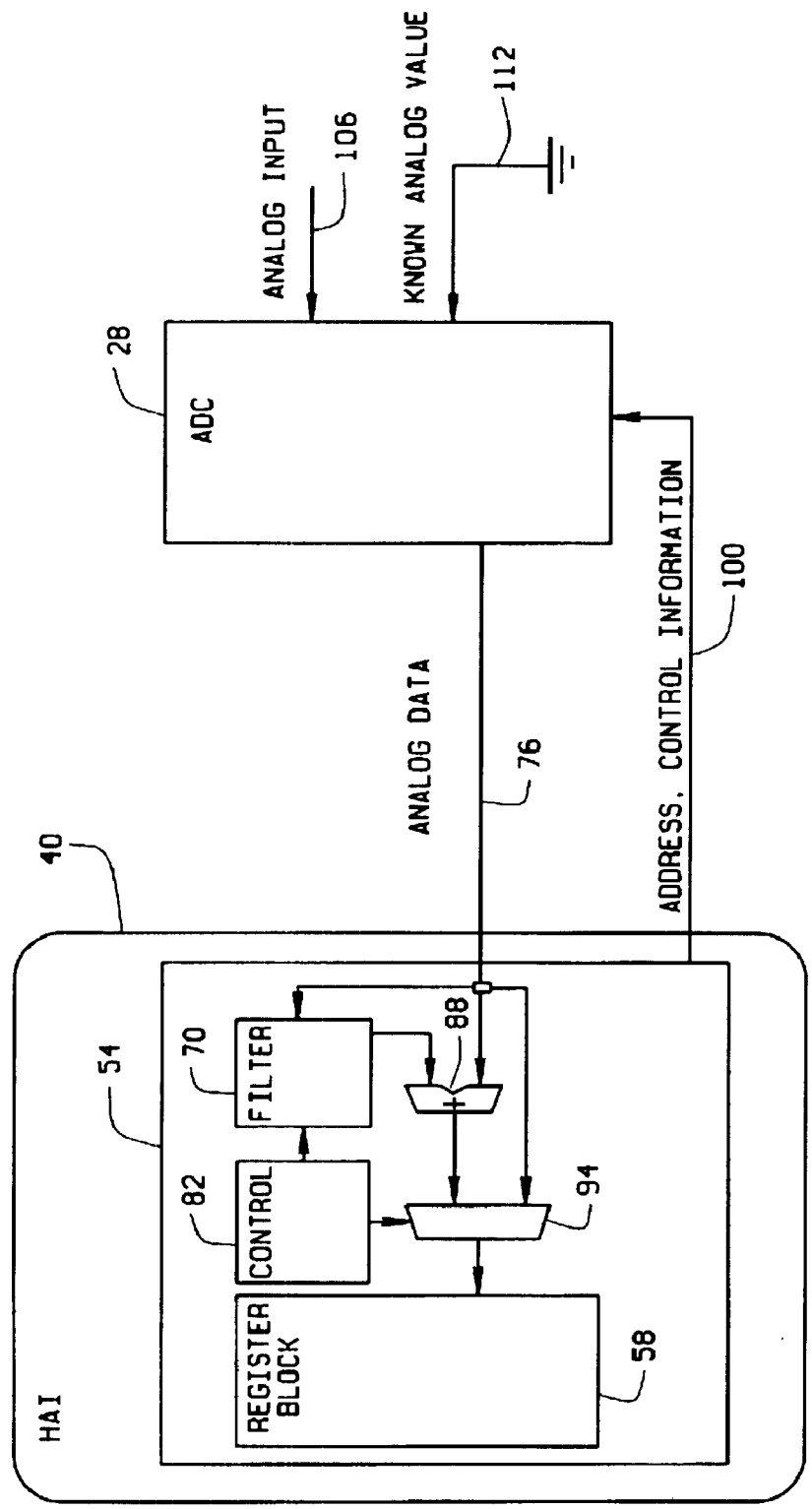
FIG. 2 is a block diagram illustrating a self-calibration feature of the analog input/output module shown in FIG. 1.

FIG. 2 is a block diagram illustrating the self-calibration feature of analog input module 16 shown in FIG. 1. Components of FIG. 2 identical to components shown in FIG. 1 are identified using the same reference numerals as used in FIG. 1. Self-calibration function block 54 adjusts analog values to account for drift in the performance of module 16 associated with temperature shift, electromagnetic noise, and any other factor that causes the performance of module 16 to drift. In one embodiment, HAI 40 includes shared register block 58 for storing data, a filter 70 for filtering analog data 76 output from ADC 28, and a control 82 for enabling self-calibration function block 54. Additionally, data transmitted from ADC 28 to shared register block 58, and from filter 70 to register block 66 passes through an arithmetic block 88 and a gate 94. HAI 40 controls the operation of ADC 28 using a control line 100. Analog values 106 are input to ADC 28 and HAI 40 cycles through input channels (not shown) of ADC 28, reading analog data 76 into shared register block 58. When self-calibration function block 54 is enabled by control 82, HAI 40 reads a known value 112 through ADC 28 as one channel during the channel sweep. Analog data 76 includes a digital value (not shown) of known analog value 112. Filter 70 filters the digital value to prohibit transient noise disruptions. The difference between the known analog value and the filtered value is used to adjust the analog values read from the other channels of ADC 28.

In one embodiment, filter 70 is an auto-regressive filter used to average the first two hundred and fifty six values received from ADC 28. Every value read by self-calibration block 54 after the first two hundred and fifty six known analog values, is added and the average is subtracted, resulting in filter 70 operating in accordance with the function, V=(A(p)/256 s)(255/256)m+s; where A(p) is the current arithmetic block value, V is the new filtered value, m is the number of new samples, and s is the new sample value.

Shared register block 58 stores data as it is passed from ADC 28 to PLC processor 12, and from PLC processor 12 to DAC 34. In one embodiment, ADC 28 is a converter such as an Analog Devices AD977, a Burr Brown ADS7809, or a Burr Brown ADS7808, and DAC 34 is a converter such as an Analog Devices AD7834.

The analog interface module provides an interface between an analog signal and a programmable logic controller, utilizing a high density analog interface having a data scaling feature, a diagnostics feature, a self-calibration feature, and an interfacing feature on a single application specific integrated circuit chip.

While the invention has been described in terms of various specific embodiments, those skilled in the art will recognize that the invention can be practiced with modification within the spirit and scope of the claims.

What is claimed is:

1. A method for interfacing a programmable logic controller (PLC) with at least one of an analog to digital converter (ADC) and a digital to analog converter (DAC), using a high density analog interface (HAI), the PLC including a backplane, said method comprising the steps of:
   scaling data using a data scaling function;
   verifying interfacing function using a diagnostics function;
   calibrating the interface to compensate for analog drift using a self-calibration function;
   routing ADC or DAC data through the data scaling function to the PLC backplane; and
   routing ADC or DAC data through the data scaling function from the PLC backplane.

2. A method in accordance with claim 1 wherein the HAI configured to be implemented in an application specific integrated circuit (ASIC), said method further comprising the step of operating the HAI in either a 0–20 mA range or a 4–20 mA range.

3. A method in accordance with claim 2 wherein said step of scaling data further comprises the steps of:
   scaling data digitally according to the function $F(x)=(5/4)x-8000$ when converting incoming data from the ADC in the 0–20 mA operating range to the 4–20 mA operating range.

4. A method in accordance with claim 2 wherein said step of scaling data further comprises the steps of:
   scaling data digitally according to the function $F(x)=(4/5)x+6400$ when converting outgoing data in the 0–20 mA range to the DAC operating in the 4–20 mA range.

5. A method in accordance with claim 1 wherein said step of verifying functionality further comprises the steps of:
   generating a known analog value;
   reading the known value through an ADC data path obtaining a read value;
   comparing the read value to a specified range; and
   setting an error bit if the read value is outside of the specified range.

6. A method in accordance with claim 1 wherein said step of verifying functionality further comprises the steps of:
   reading at least one value from an analog input channel multiplexed to the ADC; and
   setting a bit indicating an open wire exists on the analog input channel when the at least one value is less than 2 mA.

7. A method in accordance with claim 1 further comprising the steps of:
   reading a set of values from a plurality of analog input channels multiplexed to the ADC; and
   storing the set of values in a register.

8. A method in accordance with claim 7 wherein said step of calibrating further comprises the steps of:
   reading a known value from an analog input channel multiplexed to the ADC;
   calculating a filtered value to compensate for transient noise errors; and
   adjusting the set of values stored in the register based on the difference between the known value and the filtered value.

9. A method in accordance with claim 1 wherein said step of routing further comprises the steps of:
   allowing communication between the ADC and the HAI;
   allowing communication between the DAC and the HAI; and
   allowing communication between the HAI and the PLC through the PLC backplane.

10. An analog input/output module comprising at least one of an analog to digital converter (ADC) and a digital to analog converter (DAC), and an analog interface, said interface comprising:
    a data scaling function block;
    a diagnostics function block configured to verify functionality of said interface;
    a self-calibration function block configured to compensate for drift in said ADC; and
    a shared register interface function block configured to electronically connect with a programmable logic controller (PLC).

11. A module in accordance with claim 10 wherein said interface configured to be implemented in an application specific integrated circuit (ASIC).

12. A module in accordance with claim 10 wherein said interface configured to operate in one of a 0–20 mA range and a 4–20 mA range.

13. A module in accordance with claim 12 wherein said data scaling first function block configured to digitally scale data according to the function $F(x)=(5/4)x-8000$ when converting incoming data from said ADC in the 0–20 mA operating range to the 4–20 mA operating range.

14. A module in accordance with claim 12 wherein said data scaling first function block configured to digitally scale data according to the function $$F(x)=(4/5)x+6400$$

when converting outgoing data in the 0–20 mA range to said DAC operating in the 4–20 mA range.

15. A module in accordance with claim 10 wherein said diagnostics function block configured to generate a known analog value and read the known value through an ADC data path, said diagnostics function block further configured to compare the read value to a specified range.

16. A module in accordance with claim 14 wherein said diagnostics function block further configured to set an error bit if the read value is outside of the specified range.

17. A module in accordance with claim 10 wherein said diagnostics function block further configured to read at least one value from an analog input channel multiplexed to said ADC.

18. A module in accordance with claim 17 wherein said diagnostics function block further configured to set a bit indicating an open wire exists on the analog input channel when the at least one value is less than 2 mA.

19. A module in accordance with claim 10 further configured to:
read a set of values from a plurality of analog inputs channels multiplexed to said ADC; and
store the values in a register.

20. A module in accordance with claim 19 wherein said self-calibration function block configured to:
read a known value from an analog input channel multiplexed to said ADC; and
calculate a filtered value to compensate for transient noise errors.

21. A module in accordance with claim 20 wherein said self-calibration function block further configured to adjust the set of values stored in the register based on a difference between the known value and the filtered value.

22. A module in accordance with claim 10 wherein the PLC includes a backplane, said shared interface function block configured to allow communication between the PLC and said ADC and said DAC through the backplane.

23. A analog interface configured as an interface between a programmable logic controller (PLC) and at least one of an analog to digital converter (ADC) and a digital to analog converter (DAC), the PLC including a central processing unit (CPU) and a backplane, said interface comprising:
a data scaling function block;
a diagnostics function block configured to verify functionality of said scaling function block;
a self-calibration function block configured to compensate for drift in an output of the ADC; and
a shared interface function block configured to electronically connect the analog interface with the PLC.

24. An interface in accordance with claim 23 further configured to be implemented in an application specific integrated circuit (ASIC).

25. An interface in accordance with claim 23 further configured to operate in at least one of a 0–20 mA range and a 4–20 mA range.

26. An interface in accordance with claim 25 wherein said data scaling first function block configured to digitally scale data according to the function $$F(x)=(5/4)x-8000$$

when converting incoming data from the ADC in the 0–20 mA operating range to the 4–20 mA operating range.

27. An interface in accordance with claim 25 wherein said data scaling first function block configured to digitally scale data according to the function $$F(x)=(4/5)x+6600$$

when converting outgoing data in the 0–20 mA range to the DAC operating in the 4–20 mA range.

28. An interface in accordance with claim 23 wherein said diagnostics function block configured to generate a known analog value and read the known value through an ADC data path, said diagnostics function block further configured to compare the read value to a specified range.

29. An interface in accordance with claim 25 wherein said diagnostics function block further configured to set an error bit if the read value is outside of the specified range.

30. An interface in accordance with claim 23 wherein said diagnostics function block further configured to read at least one value from an analog input channel multiplexed to the at least one ADC.

31. An interface in accordance with claim 30 wherein said diagnostics function block further configured to set a bit indicating an open wire exists on the analog input channel when the at least one value is less than 2 mA.

32. An interface in accordance with claim 23 further configured to read a set of values from a plurality of analog input channels multiplexed to the at least one ADC and store the values in a register.

33. An interface in accordance with claim 32 wherein said self-calibration function block configured to read a known value from an analog input channel multiplexed to the at least one ADC and to calculate a filtered value to compensate for transient noise errors.

34. An interface in accordance with claim 33 wherein said self-calibration function block further configured to adjust the set of values stored in the register based on a difference between the known value and the filtered value.

35. An interface in accordance with claim 23 wherein said shared interface function block configured to allow communication between the PLC and the ADC and the DAC through the backplane.

* * * * *